(12) United States Patent
Kwon et al.

(10) Patent No.: US 10,043,973 B2
(45) Date of Patent: Aug. 7, 2018

(54) RESISTANCE RANDOM ACCESS MEMORY DEVICE

(71) Applicant: SEOUL NATIONAL UNIVERSITY R&DB FOUNDATION, Seoul (KR)

(72) Inventors: Deok Hwang Kwon, Seoul (KR); Mi Young Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/549,573

(22) PCT Filed: Aug. 26, 2015

(86) PCT No.: PCT/KR2015/008899
§ 371 (c)(1),
(2) Date: Aug. 8, 2017

(87) PCT Pub. No.: WO2016/143960
PCT Pub. Date: Sep. 15, 2016

(65) Prior Publication Data
US 2018/0026184 A1      Jan. 25, 2018

(30) Foreign Application Priority Data
Mar. 12, 2015   (KR) .................. 10-2015-0034210

(51) Int. Cl.
*H01L 45/00*      (2006.01)

(52) U.S. Cl.
CPC ........ *H01L 45/145* (2013.01); *H01L 45/1253* (2013.01)

(58) Field of Classification Search
CPC . H01L 45/145; H01L 45/1253; H01L 45/146; H01L 45/08; H01L 45/147
See application file for complete search history.

(56) References Cited

U.S. PATENT DOCUMENTS 8,288,297 B1 * 10/2012 Wang .................. C23C 16/40
257/E21.159
8,472,237 B2 * 6/2013 Oh .................. G11C 13/0002
365/148
(Continued)

FOREIGN PATENT DOCUMENTS

JP      2012-84774 A    4/2012
JP      2013-69869 A    4/2013
(Continued)

OTHER PUBLICATIONS

Bersuker et al., Metal oxide resistive memory switching mechanism based on conductive filament properties, 2011, Journal of Applied Physics, vol. 110 Issue 12, p. 124518, 12p, Dec. 2011.*
(Continued)

*Primary Examiner* — Nikolay Yushin
(74) *Attorney, Agent, or Firm* — Stein IP, LLC

(57) ABSTRACT

Provided is a resistance random access memory device comprising: a first electrode; a second electrode; and a metallic oxide formed between the first electrode and the second electrode. Particularly, provided is a resistance random access memory device wherein the metallic oxide comprises a first crystal grain and a second crystal grain which differ from each other in crystallographic orientation and form a boundary area; wherein a surface is intervened between the first crystal grain and the second crystal grain in the boundary area, the surface having a surface index corresponding to a surface crystallographically consisting only of oxygen among the crystal faces of the metallic oxide; and wherein the boundary area is a surface in which an electrically conductive path is formed when voltage is applied between the first electrode and the second electrode.

6 Claims, 5 Drawing Sheets

(56) References Cited

U.S. PATENT DOCUMENTS

| | | | | |
|---|---|---|---|---|
| 2008/0128853 A1* | 6/2008 | Choi | ................. | H01L 45/1683 |
| | | | | 257/530 |
| 2011/0305066 A1* | 12/2011 | Nazarian | ............ | G11C 13/0011 |
| | | | | 365/148 |
| 2012/0261638 A1* | 10/2012 | Sills | ................... | H01L 27/2463 |
| | | | | 257/5 |
| 2012/0292584 A1* | 11/2012 | Rocklein | ................ | H01L 45/08 |
| | | | | 257/2 |
| 2013/0082232 A1* | 4/2013 | Wu | ....................... | H01L 45/08 |
| | | | | 257/5 |
| 2013/0258740 A1 | 10/2013 | Zhang | ............................ | 365/51 |

FOREIGN PATENT DOCUMENTS

| | | |
|---|---|---|
| JP | 2013-201276 A | 10/2013 |
| KR | 10-2013-0139217 A | 12/2013 |
| WO | WO 2011/159705 A2 | 12/2011 |

OTHER PUBLICATIONS

International Search Report dated Dec. 21, 2017, issued to International Application No. PCT/KR2015/008899.

\* cited by examiner (a) (112),(110) plane
(b) (100) plane
(c) (111) plane

RESISTANCE RANDOM ACCESS MEMORY DEVICE

CROSS-REFERENCE TO RELATED APPLICATIONS

This application is a national stage of International Application No. PCT/KR2015/008899, filed Aug. 26, 2015, which claims the benefit of priority to Korean Application No. 10-2015-0034210, filed Mar. 12, 2015, in the Korean Intellectual Property Office, the disclosures of which are incorporated herein in their entireties by reference.

TECHNICAL FIELD

The present disclosure relates to a semiconductor memory, and more particularly, to a resistive random access memory (ReRAM) using an oxide as a variable resistance material.

BACKGROUND ART

Since the late 1900s, semiconductor memories have been used in a variety of electronic devices including PCs and demand therefor has rapidly increased. With such market demand, the degree of integration of semiconductor devices has been increased year by year based on the development of semiconductor processing technology.

For high integration of semiconductor devices, although much research has been carried out to reduce device size, downscaling of the devices has reached a physical limit. Recently, studies are being actively carried out to improve the integration degree by changing conditions other than device size. Particularly, there have proposed a method of stacking memory cells formed of a stackable material one above another and a method of improving information storage capacity of a device to store multiple pieces of information in one cell (multi-level cell technology).

For ReRAMs, research is being conducted to realize a highly integrated memory using 3D stacking technology, taking advantage of the fact that all processes can be performed at a lower temperature than silicon processes and the thin film forming process is simple. However, a switching mechanism causing ReRAM behavior has not yet been clarified and several research groups are continuing to study the principles of resistance change. In addition, in order to put ReRAMs into practical use, it is essential to develop new materials and optimal deposition process technology and to secure device stability and uniformity.

DISCLOSURE

Technical Problem

The present disclosure discloses a switching mechanism of a ReRAM to solve various problems including the aforementioned problems and exemplary embodiments of the present disclosure provide a ReRAM which can have high stability and uniformity. However, it should be understood that the present disclosure is not limited to the following embodiments and should be defined only by the accompanying claims and equivalents thereof.

Technical Solution

In accordance with one aspect of the present disclosure, there is provided a resistive random access memory. The resistive random access memory includes: a first electrode; a second electrode; and a metal oxide formed between the first electrode and the second electrode.

The metal oxide may include a first crystal grain and a second crystal grain having different crystal orientations and forming a boundary region therebetween, and, among crystal planes of the metal oxide, a plane having a plane index corresponding to a plane crystallographically consisting of oxygen may be interposed between the first crystal grain and the second crystal grain in the boundary region.

Here, the boundary region may be a plane in which a conductive path, that is, a filament, is formed when voltage is applied between the first electrode and the second electrode.

The metal oxide may include a strontium-titanium composite oxide; the first crystal grain may have a (111) plane preferred orientation with respect to a reference plane formed by contact between a layer of the metal oxide and any one of the first electrode and the second electrode; and the second crystal grain may have a (110) plane preferred orientation with respect to the reference plane.

The plane of the boundary region may include at least one selected from members of the {121} or {110} family.

The metal oxide may include at least one crystalline oxide selected from among titanium dioxide ($TiO_2$), nickel oxide (NIO), niobium oxide ($Nb_2O_5$), titanium strontium oxide ($SrTiO_3$), barium titanate ($BaTiO_3$), cobalt oxide (CoO), copper oxide (CuO), magnesium oxide (MgO), zinc oxide (ZnO), manganese oxide ($MnO_2$), zirconium oxide ($ZrO_2$), hafnium oxide ($HfO_2$), vanadium oxide ($VO_2$), molybdenum oxide ($Moo_3$), tungsten oxide ($WO_3$), iron oxide ($Fe_2O_3$), calcium titanate ($CaTiO_3$), and strontium zirconate ($SrZrO_3$).

The plane of the boundary region may be a twisted grain boundary between the first crystal grain and the second crystal grain.

At least one of the first electrode and the second electrode may be a plate or rod type electrode.

Advantageous Effects

According to the present disclosure, it is possible to realize a thin film structure for an ReRAM which can individually control the physical and electrical properties of the ReRAM, thereby improving lifespan and stability of the ReRAM. It should be understood that the scope of the present disclosure is not limited to the aforementioned effects.

BEST MODE

Figure 1A:
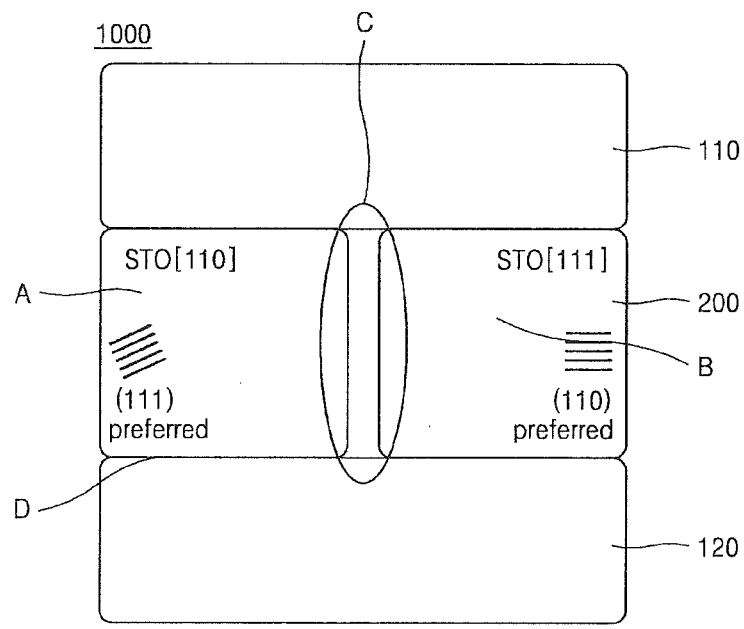
FIGS. 1A to 1D are views illustrating a process of formation of a filament in a resistive random access memory according to one embodiment of the present disclosure.

Hereinafter, embodiments of the present disclosure will be described in detail with reference to the accompanying drawings. It should be understood that the present disclosure is not limited to the following embodiments and may be embodied in different ways, and that the embodiments are provided for complete disclosure and a thorough understanding of the present disclosure by those skilled in the art. In addition, the drawings are not to precise scale and may be exaggerated in thickness of lines or size of components for descriptive convenience and clarity only. It can be anticipated that various modifications of shapes shown in the drawings can be made depending upon, for example, manufacturing techniques and/or tolerances. Accordingly, embodiments of the present disclosure is not to be interpreted as being limited to certain shapes illustrated in the specification and include changes encountered during manufacture.

Figure 6:
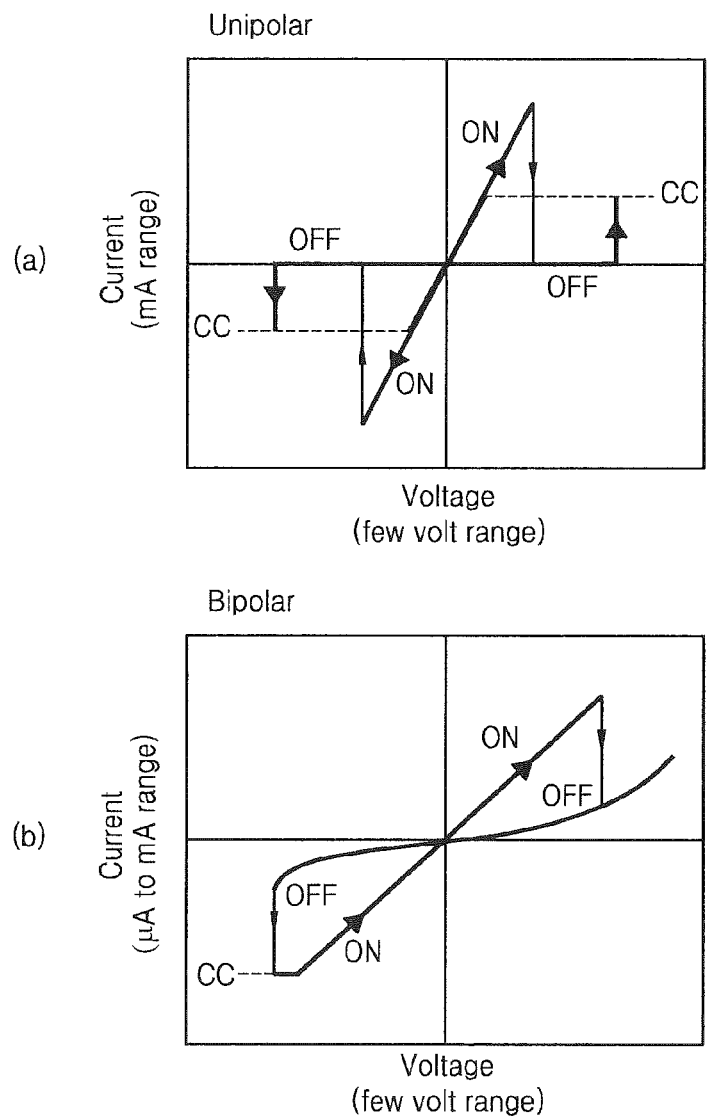
FIG. 6 is a graph showing current-voltage characteristics of a typical resistive random access memory.

Unlike DRAM and flash devices using a typical charge-storage capacitor, a resistive random access memory includes a thin film having a simple MIM (metal/insulator/metal) structure and utilizes nonvolatile 'resistive switching' in an oxide of the MIM structure. A resistive random access memory (ReRAM) is divided into a unipolar type and a bipolar type depending on switching behavior. FIGS. 6(a) and 6(b) show current-voltage characteristic curves of thin film structures for unipolar and bipolar resistive random access memories, respectively.

Referring to FIGS. 6(a) and 6(b), it can be seen that both the thin film structures can be in two different resistance states under a given voltage. Once a state change occurs, each of the thin film structures remains in that state until next switching occurs, even when external power is not supplied. Generally, a low-resistance state is referred to as 'ON' state and a high-resistance state is referred to as 'OFF' state. The thin film structures may be used as a memory capable of storing 2-bit information using the two states. However, it should be understood that multiple resistance states may be induced depending on conditions such that the thin film structures can be used as a multi-level memory.

The ReRAM is initially in the 'OFF' state, i.e. a high-resistance state. When a specific voltage is applied to the ReRAM having the MIM structure in the initial state, switching from the high-resistance state to the 'ON' state, i.e. a low-resistance state, occurs. When the ReRAM exhibits this behavior, it is said that the ReRAM is "set" and the specific voltage is referred to as "set voltage". Once the ReRAM is switched to the 'ON' state, the ReRAM remains in that state until another specific voltage is applied to the ReRAM. When the ReRAM exhibits this behavior, it is said that the ReRAM is "reset" and the specific voltage is referred to as "reset voltage".

When the ReRAM has, for example, a unipolar structure, the ReRAM is set through a process similar to dielectric breakdown that occurs when a voltage exceeding a certain threshold value is applied to a dielectric layer. In other words, when the set voltage is applied to the ReRAM, the ReRAM undergoes soft breakdown causing a filament, i.e. a conductive path through which a current locally flows, to be formed in an insulating layer. As a result, the ReRAM is switched to the 'ON' state. When the reset voltage is applied to the ReRAM in the 'ON' state and a critical current flows through the ReRAM, the conductive filament is cut and the ReRAM is returned to the 'OFF' state.

The filament has a small diameter of several tens of nanometers (nm) or less. Thus, a current flowing through the filament causes high joule heating, which is accompanied by electric or chemical reaction, thereby causing a change in resistance. The filament is formed at one of several dislocations and thus cannot be uniformly controlled in an individual manner. Now, a thin film structure for a ReRAM according to one embodiment of the invention, which can solve this problem, will be described in detail with reference to FIGS. 1A to 1D, 2, and 3.

FIGS. 1A to 1D are schematic views illustrating a process of formation of a filament in a ReRAM according to one embodiment of the present disclosure, which includes a metal oxide thin film as a resistance variable material.

Referring to FIG. 1A, the ReRAM according to this embodiment may include a first electrode 110 and a second electrode 120. One of the first electrode 110 and the second electrode 120 may be grounded and a positive or negative bias may be applied to the other. In addition, the ReRAM includes a metal oxide 200 as a resistance variable material between the first electrode 110 and the second electrode 120. The metal oxide 200 shown in FIGS. 1A to 1D is strontium titanate ($SrTiO_3$) having a perovskite structure. Hereinafter, embodiments of the present disclosure will be described by taking strontium titanate ($SrTiO_3$) as an example of the metal oxide. However, it should be understood that the present disclosure is not limited thereto, the metal oxide 100 may include any other metal oxide that can be used in the ReRAM, for example, at least one crystalline oxide selected from among titanium dioxide ($TiO_2$), nickel oxide (NiO), niobium oxide ($Nb_2O_5$), barium titanate ($BaTiO_3$), cobalt oxide (CoO), copper oxide (CuO), magnesium oxide (MgO), zinc oxide (ZnO), manganese oxide ($MnO_2$), zirconium oxide ($ZrO_2$), hafnium oxide ($HfO_2$), vanadium oxide ($VO_2$), molybdenum oxide ($MoO_3$), tungsten oxide ($WO_3$), iron oxide ($Fe_2O_3$), calcium titanate ($CaTiO_3$), strontium zirconate ($SrZrO_3$), and the like.

$SrTiO_3$ 200 may include a first crystal grain A and a second crystal grain B having different crystal orientations and forming a boundary region therebetween. The first crystal grain A has a (111) plane preferred orientation with respect to a reference plane D formed by contact between the second electrode 120 and a layer of $SrTiO_3$ 200, and the second crystal grain B has a (110) plane preferred orientation with respect to the reference plane D. In FIG. 1A, STO denotes $SrTiO_3$ and the same applies to the other drawings. Here, the boundary region C between the first crystal grain A and the second crystal grain B is a twisted grain boundary and includes any one of members of the {121} or {110} family, which crystallographically consist of oxygen.

Herein, the twisted grain boundary refers to a grain boundary formed by crystal grains on both sides of a grain boundary plane, which are rotated with respect to each other about an axis perpendicular to the grain boundary plane. By way of example, the first crystal grain A and the second crystal grain B shown in FIGS. 1A to 1D form a 90 degree twisted grain boundary.

Figure 2:
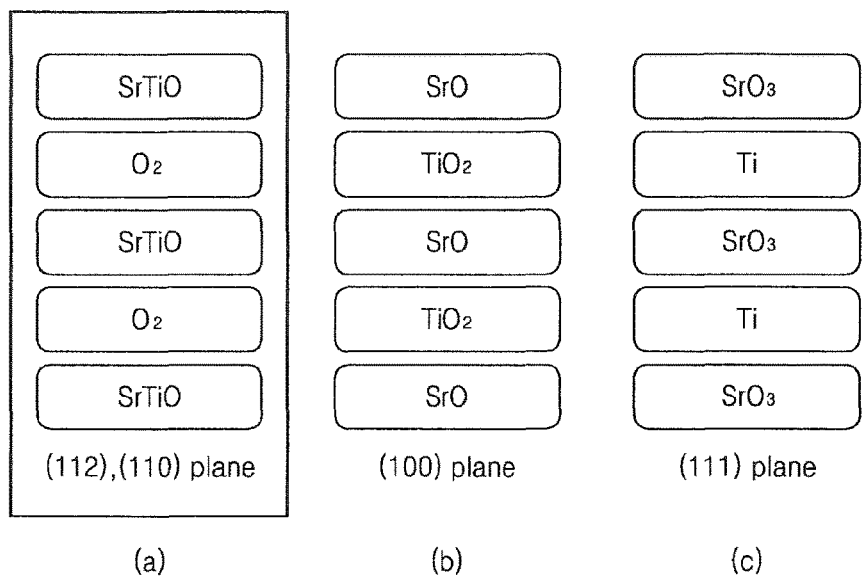
FIG. 2 is a view showing $SrTiO_3$, which is a metal oxide for the resistive random access memory according to the embodiment of the present disclosure, according to plane index.

FIG. 2 is a diagram of $SrTiO_3$ having a perovskite structure according to plane index. Referring to FIG. 2(a), a crystal plane of $SrTiO_3$ having a plane index corresponding to the {121} or {110} family can have a layer consisting of oxygen ($O_2$). In comparison, referring to FIGS. 2(b) and 2(c), in the (100) plane (i.e. in the [100] direction), strontium oxide (SrO) and titanium dioxide ($TiO_2$) layers are alternately stacked one above another, and, in the (111) plane (i.e. in the [111] direction), strontium oxide ($SrO_3$) and titanium (Ti) layers are alternately stacked one above another. In other words, $SrTiO_3$, which is a composite oxide of Ti and Sr, can have a plane consisting of oxygen in a specific crystal direction. Such a plane can include, for example, the (112) plane and the (110) plane. It should be understood that the aforementioned plane index is for $SrTiO_3$, and, for other oxides, the plane index of a crystal plane consisting of oxygen can have a different value.

Figure 3:
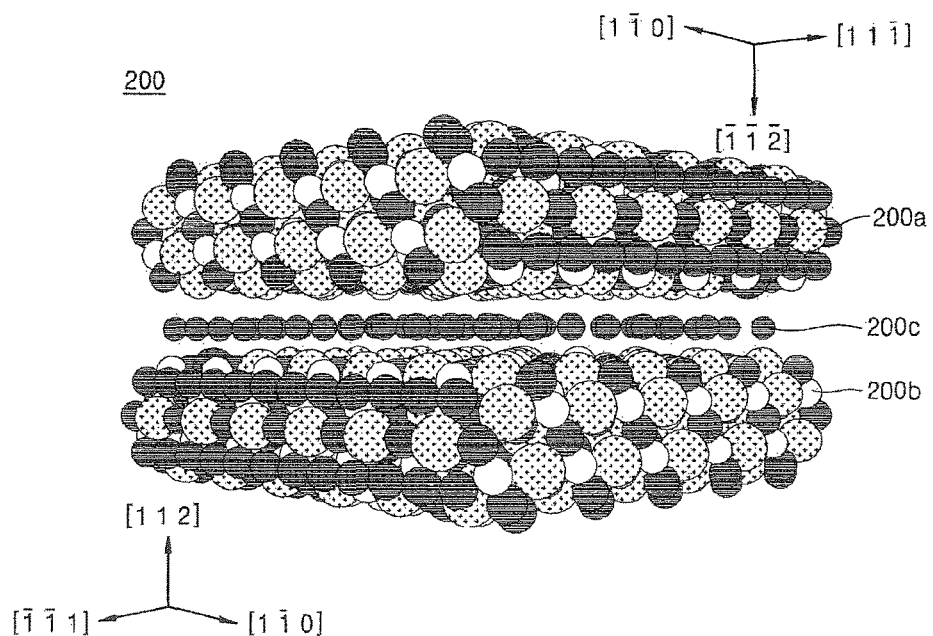
FIG. 3 is a view illustrating a twisted grain boundary consisting of oxygen between different crystal grains of $SrTiO_3$, which is a metal oxide for a resistive random access memory according to one experimental example of the present disclosure.
Figure 4:
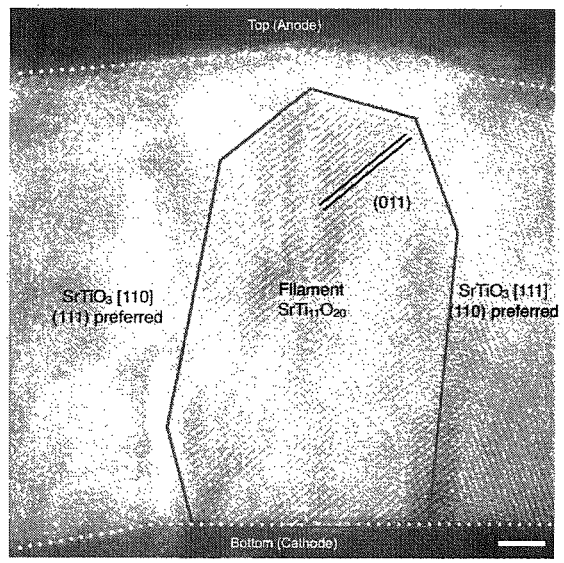
FIG. 4 is a transmission electron micrograph (TEM) of a filament formed in a $SrTiO_3$ thin film of the resistive random access memory according to the experimental example of the present disclosure.

FIG. 3 illustrates a case where the interface between the first crystal grain A and the second crystal grain B having a 90 degree twisted grain boundary is the (112) plane. Referring to FIG. 3, each of the first crystal grain A and the second crystal grain B consists of strontium atoms 200a, titanium atoms 200b, and oxygen atoms 200c. The twisted grain boundary between the first crystal grain A and the second crystal grain B is formed as the (112) plane, which is a plane consisting of oxygen 200c. Thus, as shown in FIG. 3, the first crystal grain A and the second crystal grain B are alternately rotated about a common vertical axis, i.e. the [112] direction, to form a twisted grain boundary, which has a plane index corresponding to (112). FIG. 4 is a conceptual view of a crystallographic structure. Actually, the boundary region C, that is, the grain boundary can have a structure in which atoms are arranged irregularly rather than regularly due to the presence of crystal defects, or can have an amorphous shape.

The present inventors found that, when different crystal grains form a grain boundary in such a metal oxide, a filament is formed at the grain boundary crystallographically consisting of oxygen upon application of voltage between the first electrode and the second electrode. As described above, it is generally known that the filament is formed at any one of several dislocations. With current knowledge, it is not possible to determine at which dislocation or defect the filament is formed. A ReRAM is disadvantageous in that drive voltage and current greatly change during each operation. This is because the filaments formed in the ReRAM are not uniformly controlled in an individual manner. In order to solve this problem, the present disclosure allows a grain boundary between different crystal grains to be formed as a plane crystallographically consisting of oxygen, thereby providing a position where the filament is formed. Due to the nature of oxygen ions, such a grain boundary having an open structure can have high ionic conductivity while initially providing a high leakage current due to a large difference in stoichiometric ratio. The filament can be formed at this position since these conditions are simultaneously satisfied.

Using the coherent growth relationship between the lower electrode and the metal oxide thin film, it is possible to change the crystal growth direction depending on the conditions during thin film growth (oxygen fraction, temperature, and the like). By this method, a plane crystallographically consisting of oxygen may be interposed between at least two crystal structures, thereby forming a filament.

For example, when one filament is formed at one grain boundary, the area of an operating device can be limited within the grain boundary region. Thus, the region of the operating device can be reduced to about 10 nm or less. In addition, the physical and electrical properties of the filament can be individually controlled, whereby the driving region of the ReRAM can be narrowed within a specific region, thereby allowing drive voltage and current to be efficiently controlled. In particular, since the drive voltage and current can be controlled in a desired region, the endurance and retention of the ReRAM can be improved.

Figure 1B:
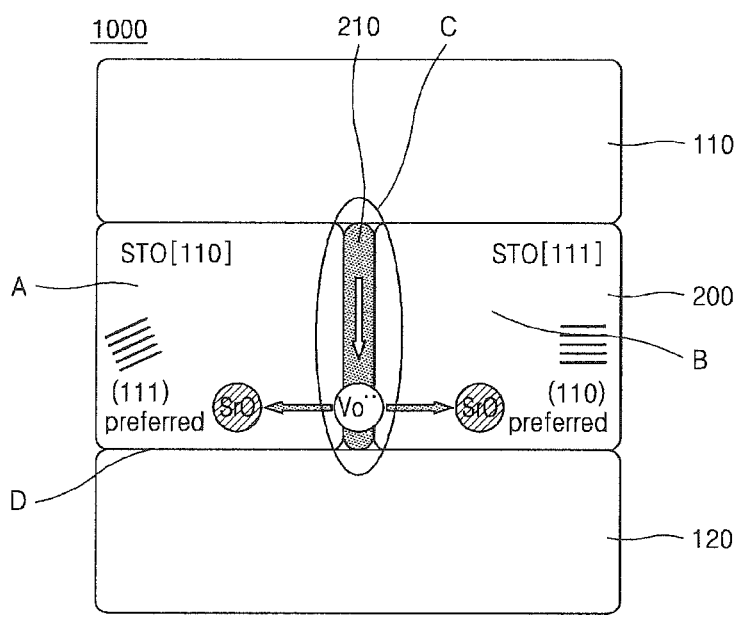

Referring to FIG. 1B, the boundary region C between the first crystal grain A and the second crystal grain B as shown in FIG. 1A can serve as a heat source. For example, when voltage is applied between the first electrode 110 and the second electrode 120, oxygen vacancies ($Vo^-$)) can gradually accumulate at the plane in the boundary region C, consisting of oxygen. As a result, reduction of a strontium oxide (SrO) compound can be accelerated.

Figure 1C:
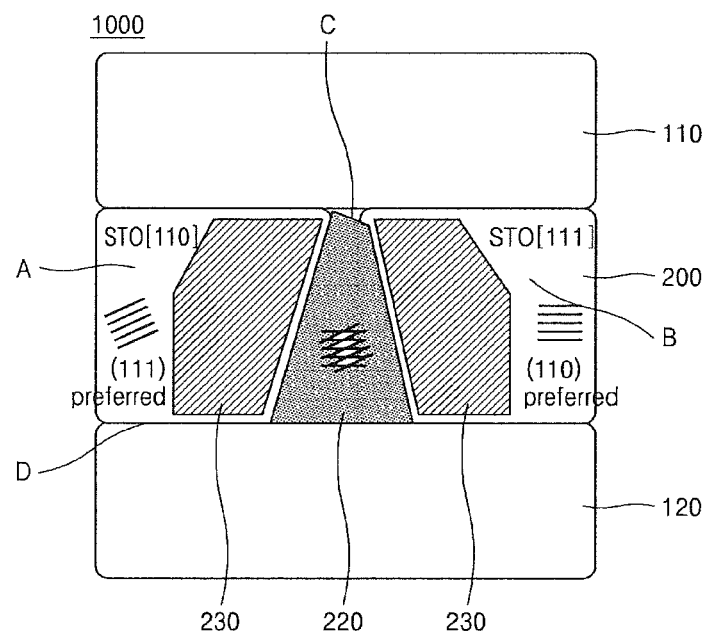

Referring to FIG. 1C, when voltage is continuously applied, the oxygen vacancies 210 diffuse, causing the boundary region between the first crystal grain A and the second crystal grain B to become wider, and non-stoichiometric titanium-strontium oxide ($SrTi_{11}O_{20}$) and a Ruddlesden-Popper (RP) phase 230 are produced.

Hereinafter, the non-stoichiometric titanium-strontium oxide ($SrTi_{11}O_{20}$) may be referred to as a filament 220. That is, when voltage is continuously applied between the first electrode 110 and the second electrode 120, a conductive path, i.e. the filament 220, can be formed in the boundary region. In other words, the filament allows electricity to be conducted therethrough.

Figure 1D:
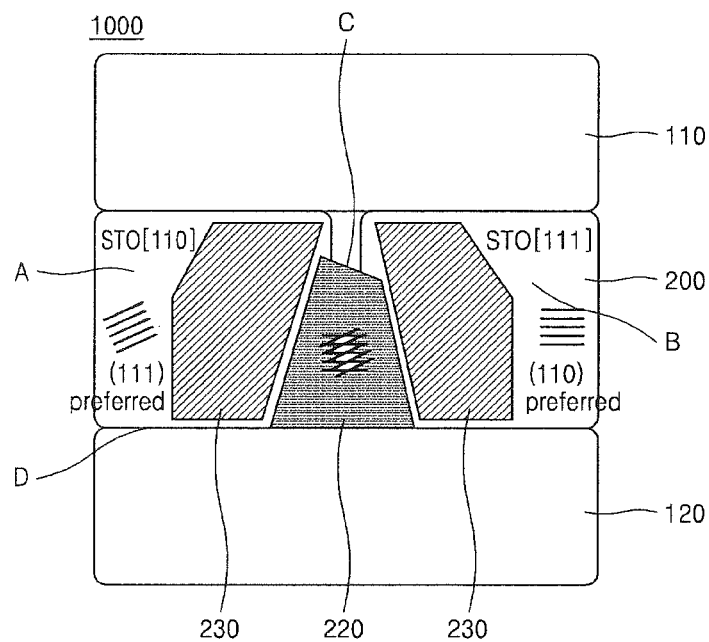

Finally, referring to FIG. 1D, the filament 220 can be broken by heat generated in the boundary region. That is, the filament 220 can be cut by Joule heating in a local region.

Although the ReRAM according to this embodiment has a MIM structure including a plate-type electrode, it should be understood that the present disclosure is not limited thereto and may be applied to a ReRAM including an electrode having various shapes, such as a rod-type electrode.

Next, the present disclosure will be described in more detail with reference to examples. However, it should be noted that these examples are provided for illustration only and should not be construed in any way as limiting the invention.

Experimental Example

A $SrTiO_3$ thin film was deposited on a silicon (Si) substrate coated with platinum (Pt) at 600° C. and 50 mTorr through pulsed laser deposition (PLD). As an upper electrode, platinum (Pt) was deposited through sputtering. Then, patterns (cells) having an appropriate size (about 25×25 $\mu m^2$, about 50×50 $\mu m^2$, or about 100×100 $\mu m^2$) were formed on the upper electrode through photolithography. Then, a current-voltage was applied to each pattern, followed by analysis of the ReRAM.

FIG. 4 shows a result of observing a filament formed in $SrTiO_3$ of the ReRAM manufactured in Experimental Example with a high-resolution transmission electron microscope. It can be seen that that a filament, $SrTi_{11}O_{20}$, was formed at the central portion.

Figure 5:
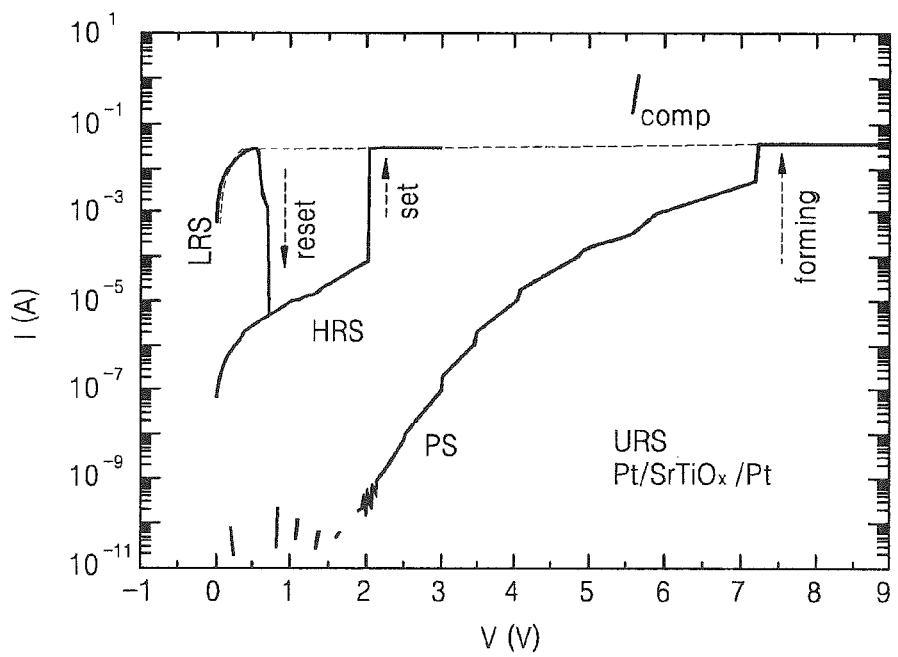
FIG. 5 is a graph showing current-voltage characteristics of the resistive random access memory according to the experimental example of the present disclosure.

FIG. 5 shows a current-voltage characteristic graph of the ReRAM manufactured in Experimental Example. Referring to FIG. 5, forming occurs at about 6 V to 7 V, and then transitions between a low resistance state (LRS) and a high resistance state (HRS) can occur, as shown on the left side of the graph. When the compliance current (Icomp) is small, a bipolar change in resistance can occur.

Although some embodiments have been described herein, it should be understood that these embodiments are provided for illustration only and are not to be construed in any way as limiting the present disclosure, and that various modifications, changes, alterations, and equivalent embodiments can be made by those skilled in the art without departing from the spirit and scope of the invention. The scope of the present disclosure should be defined by the appended claims and equivalents thereof.

The invention claimed is:

1. A resistive random access memory, comprising:
a first electrode;
a second electrode; and
a metal oxide formed between the first electrode and the second electrode,
wherein the metal oxide comprises a first crystal grain and a second crystal grain having different crystal orientations and forming a boundary region therebetween; among crystal planes of the metal oxide, a plane having a plane index corresponding to a plane crystallographically consisting of oxygen is interposed between the first crystal grain and the second crystal grain in the boundary region; and the boundary region is a plane in which a conductive path is formed when voltage is applied between the first electrode and the second electrode.

2. The resistive random access memory according to claim 1, wherein the metal oxide is strontium titanate ($SrTiO_3$) having a perovskite structure; the first crystal grain has a (111) plane preferred orientation with respect to a reference plane formed by contact between a layer of the metal oxide and any one of the first electrode and the second electrode; and the second crystal grain has a (110) plane preferred orientation with respect to the reference plane.

3. The resistive random access memory according to claim 2, wherein the plane of the boundary region comprises at least one selected from members of the {121} or {110} family.

4. The resistive random access memory according to claim 1, wherein the metal oxide comprises at least one selected from $TiO_2$, $ZrO_2$, $HfO_2$, $VO_2$, $MoO_3$, $WO_3$, $Fe_2O_3$, $CoO_3O_4$, $CuO$, $NiO$, $Nb_2O_5$, $SrTiO_3$, $BaTiO_3$, and $CaTiO_3$.

5. The resistive random access memory according to claim 1, wherein the plane of the boundary region is a twisted grain boundary between the first crystal grain and the second crystal grain.

6. The resistive random access memory according to claim 1, wherein at least one of the first electrode and the second electrode is a plate or rod type electrode.

* * * * *